United States Patent
Moctezuma et al.

(10) Patent No.: US 10,312,898 B2
(45) Date of Patent: Jun. 4, 2019

(54) METHODS AND APPARATUS FOR POWER SWITCH FAULT PROTECTION

(71) Applicant: Texas Instruments Incorporated, Dallas, TX (US)

(72) Inventors: Ariel Dario Moctezuma, Dallas, TX (US); Srinath Hosur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 304 days.

(21) Appl. No.: 15/206,014

(22) Filed: Jul. 8, 2016

(65) Prior Publication Data

US 2017/0012617 A1 Jan. 12, 2017

Related U.S. Application Data

(60) Provisional application No. 62/190,383, filed on Jul. 9, 2015.

(51) Int. Cl.
*H03K 17/082* (2006.01)
*H02H 3/26* (2006.01)
*H02H 3/087* (2006.01)
*H02H 3/10* (2006.01)

(52) U.S. Cl.
CPC ......... *H03K 17/0822* (2013.01); *H02H 3/087* (2013.01); *H02H 3/10* (2013.01); *H03K 2217/0027* (2013.01)

(58) Field of Classification Search
CPC ....... H03K 17/0822; H03K 2217/0027; H02H 3/10; H02H 3/26; H02H 3/087

USPC .......................................................... 361/79
See application file for complete search history.

(56) References Cited

U.S. PATENT DOCUMENTS

| | | | |
|---|---|---|---|
| 2010/0244800 A1* | 9/2010 | Nakamura | H02M 1/32 323/284 |
| 2011/0121804 A1* | 5/2011 | Kudo | H01L 24/34 323/282 |
| 2016/0006341 A1* | 1/2016 | Mao | H02M 1/08 363/21.17 |

* cited by examiner

*Primary Examiner* — Thienvu Tran
*Assistant Examiner* — Kevin J Comber
(74) *Attorney, Agent, or Firm* — Michael A. Davis, Jr.; Charles A. Brill; Frank D. Cimino

(57) ABSTRACT

In described examples, a switch has: a first current handling terminal coupled to a supply source terminal; and a second current handling terminal coupled to an output terminal. A comparator has: a first input coupled to the second current handling terminal; and a second input. A voltage reference source has: a first terminal coupled to the first current handling terminal; and a second terminal coupled to the second input of the comparator. A slew rate detector has an input coupled to the second current handling terminal. A switch controller has: a first input coupled to the comparator output; and a second input coupled to an output of the slew rate detector. The switch controller is coupled to output a signal to cause the switch to open when the comparator detects an over-current condition through the switch while the slew rate detector detects a negative slew rate.

18 Claims, 9 Drawing Sheets

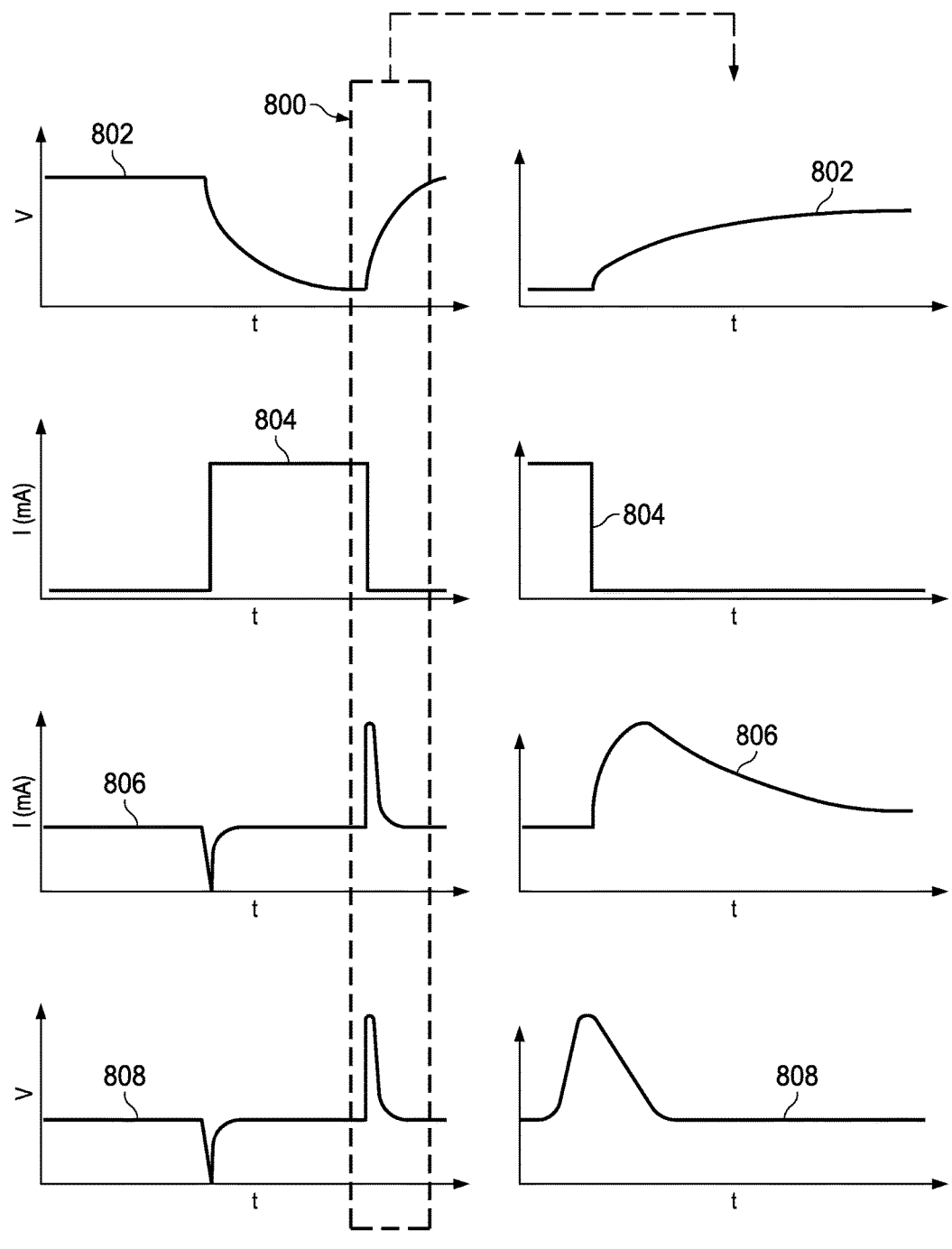

METHODS AND APPARATUS FOR POWER SWITCH FAULT PROTECTION

CROSS-REFERENCE TO RELATED APPLICATIONS

This application claims the benefit of priority under 35 U.S.C. § 119(e) to co-owned U.S. Provisional Patent Application Ser. No. 62/190,383, filed Jul. 9, 2015, entitled "Method and Circuit to Distinguish Between Benign and Malignant Power Switch Faults," naming Ariel Moctezuma et. al. as inventors, which application is hereby incorporated by reference in its entirety herein.

TECHNICAL FIELD

This relates generally to protection of integrated circuits from faults, and more particularly to protection from excessive current and reverse current faults.

BACKGROUND

A variety of faults can damage fragile semiconductor devices. Current-based faults are of particular concern because these can permanently destroy an integrated circuit. Two important types of current-based faults are excessive current and reverse current. Excessive current can create excessive heat within the integrated circuit, and such heat can destroy transistors, diodes and other components in the integrated circuit. Reverse current occurs when an external device forces a current onto the integrated circuit. Reverse current can also destroy devices on the integrated circuit. Along with the destructive effects of current induced heat, reverse current can cause many semiconductor junctions within the integrated circuit that are normally reverse biased to become forward biased. The forward bias condition allows the reverse current to create damage in many parts of the integrated circuit. For example, these problems may occur in an integrated circuit that: (a) is part of a primary device, such as a smart phone or computer; or (b) provides power to an accessory device, such as a SIM card, a credit card reader, or other accessories.

Protection devices are often included at the accessory power output terminals of integrated circuits to prevent current based faults. One such protection device includes a switch device (such a high capacity FET) coupled between the output terminal and the integrated circuitry. Circuitry within the integrated circuit monitors the voltage drop across the switch. Under certain conditions, the switch opens to decouple the integrated circuit from the output terminal. This is an effective protection technique. However, when the decoupling occurs, the accessory temporarily shuts down and then must go through its start-up cycle. Interruption of the accessory process can severely affect device and system performance. In some normal operating conditions, sufficient current flow can flow through the switch to trigger the protection circuit and cause decoupling of the accessory, even when a true current fault has not occurred. Accordingly, the protection device should be triggered only for events that truly endanger the integrity of the integrated circuit.

SUMMARY

In described examples, a switch has: a first current handling terminal coupled to a supply source terminal; and a second current handling terminal coupled to an output terminal. A comparator has: a first input coupled to the second current handling terminal; and a second input. A voltage reference source has: a first terminal coupled to the first current handling terminal; and a second terminal coupled to the second input of the comparator. A slew rate detector has an input coupled to the second current handling terminal. A switch controller has: a first input coupled to the comparator output; and a second input coupled to an output of the slew rate detector. The switch controller is coupled to output a signal to cause the switch to open when the comparator detects an over-current condition through the switch while the slew rate detector detects a negative slew rate. Detecting the slew rate sign avoids opening the switch during excess current conditions that are not dangerous to an integrated circuit or to the supply source.

BRIEF DESCRIPTION OF THE DRAWINGS

FIGS. 8A and 8B are a group of graphs and insets showing the operation of another example embodiment.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
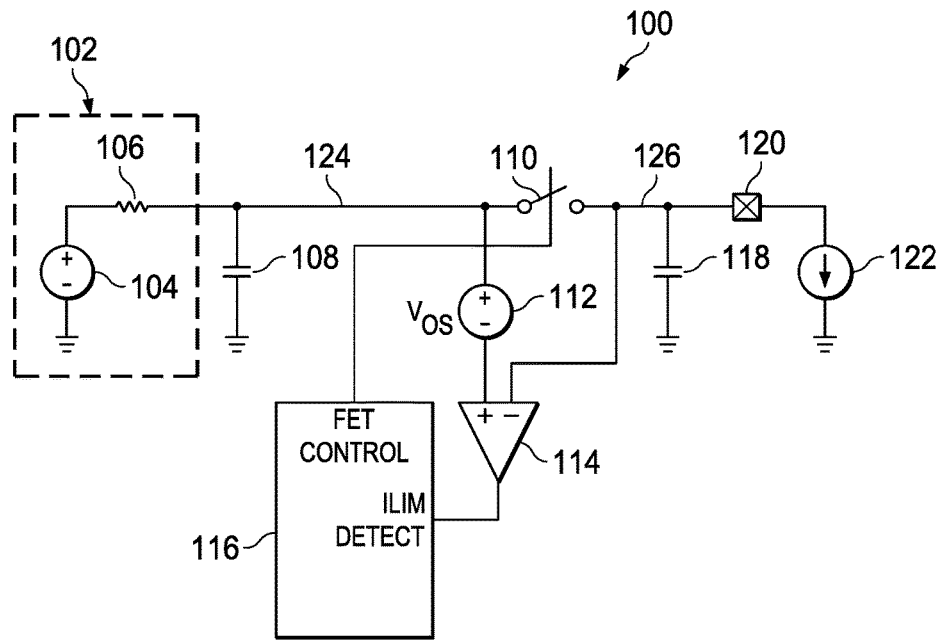
FIG. 1 is a circuit diagram of an over-current protection circuit.

FIG. 1 is a schematic diagram of a conventional over-current protection circuit 100. In FIG. 1, voltage 104 and resistor 106 represent a source circuit 102. The source circuit 102 can be a battery or other supply. The output 124 from the source circuit 102 couples to a switch 110. An output of switch controller 116 couples to a switch control terminal of the switch 110. The output of comparator 114 couples to a current limit detect input, "ILIM Detect," of switch controller 116. Comparator 114 compares the voltages at nodes 124 and 126 on either side of the switch 110. Node 126 couples to an output terminal 120 that provides current to a load 122, represented as a current sink.

In operation, voltage supply 104 and resistor 106 model the operation of the source circuit 102. Capacitor 108 models the capacitance of source circuit 102, the capacitance of the conductor that couples source circuit 102 to one current handling terminal of switch 110, and any additional capacitance from any other circuitry connected. The other current handling terminal of switch 110 couples to output terminal 120, which couples to a load 122 that is represented as a current sink. Capacitor 118 models the capacitance of the circuitry connected to terminal 120 and models the capacitance of the conductor coupling output terminal 120 to one current handling terminal of switch 110. In at least one example, switch 110 is formed by a pair of field effect transistors (FETS) sized to handle large currents. In this example, the current handling terminals of the FET pair are the current handling terminals of the switch 110 of FIG. 1, and the gates of the FET pair are the control terminal of switch 110. In alternative embodiments, a single power FET can implement switch 110 with a drain connection at node 124, the system node, and a source connection on node 126 coupled (e.g., connected) to the output terminal 120. In this example, the circuit 100 protects from excessive current in the forward direction from the source circuit 102 towards the load at terminal 120. In an alternative example, switch 110 can be a single power FET with a source at the system side at node 124, and a drain at the load side at node 126. In this alternative example, the circuit 100 protects from excessive current in the reverse direction, from the output terminal 120 towards the source circuit 102.

Node 124 is the system side of switch 110, and the output side of the switch 110 is the accessory node 126. The accessory can couple to output terminal 120. Any other load can also couple to output terminal 120.

The non-inverting input of comparator 114 couples to the system node 124 via a voltage reference 112, labeled $V_{OS}$. The inverting input of comparator 114 couples to the accessory node 126. Under normal operation, switch 110 is closed, and current flows to the output terminal 120. Current through switch 110 causes a voltage drop across switch 110, due to the on-resistance of the switch. The voltage on the non-inverting input of comparator 114 is the voltage on system node 124 minus voltage $V_{OS}$. The voltage on the inverting input of comparator 114 is the voltage on the system node 124 minus the voltage drop across switch 110 (which is the voltage at accessory node 126). During normal operation, the voltage drop across switch 110 is less than the voltage $V_{OS}$ of voltage reference 112. Thus, during normal operation, the voltage on the inverting input of comparator 114 is higher than the voltage on the non-inverting input of comparator 114. In response, comparator 114 outputs a low signal or a voltage corresponding to a logic zero. This signal couples to the ILIM Detect input of switch controller 116. Switch controller 116 then maintains switch 110 in the closed (normal) position, based on the low signal from comparator 114.

The voltage $V_{OS}$ is appropriately selected, so that if current through switch 110 exceeds an allowed amount, then the voltage drop across switch 110 will exceed $V_{OS}$. If the current through switch 110 rises to a level where the voltage drop across switch 110 exceeds $V_{OS}$, then the voltage on the inverting input of comparator 114 will be lower than the non-inverting input. Comparator 114 then outputs a logic one (high) voltage signal to the ILIM Detect input of switch controller 116. Based on this signal, switch controller 116 causes switch 110 to open, which protects source circuit 102 from an over-current condition. The signal polarities can vary without changing the operation of the circuit 100, and comparator 114 can be an inverting comparator.

The circuit 100 provides over-current protection. However, in some expected normal operational conditions, the over-current condition in circuit 100 might not be harmful to source circuit 102. For example, a supply ripple may cause a loss of charge on capacitance 118. When the supply recovers, a large amount of current will flow to capacitance 118 to recover its normal state. This type of current increase is a benign fault that is acceptable, and circuit operation should continue supplying current based on a benign fault. However, switch 110 should open for malign faults, such as a short at output terminal 120 that causes excessive current.

Figure 2:
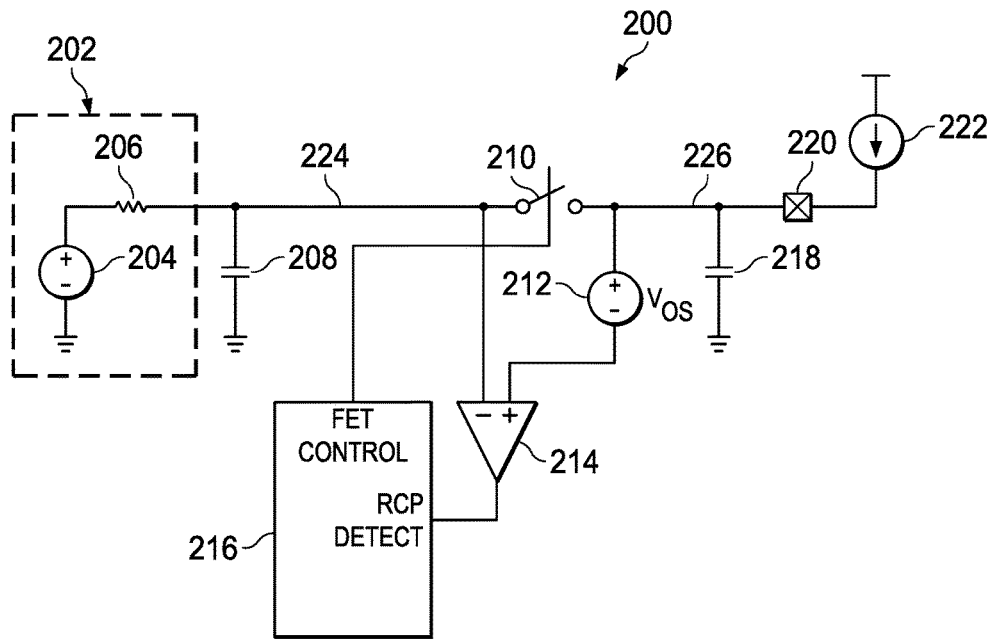
FIG. 2 is a circuit diagram of a reverse current protection circuit.

FIG. 2 is a schematic diagram of a conventional reverse current protection circuit 200. For FIG. 2's components that are similar to FIG. 1's components, corresponding reference labels are used for clarity. For example, switch 210 corresponds to the similar switch 110 in FIG. 1. In FIG. 2, a supply source 202 couples to switch 210 at node 224. The switch control terminal couples to the output "FET Control" of a switch controller 216. A comparator 214 has an output that couples to a reverse current protection input "RCP Detect" input of switch controller 216. The comparator 214 has an input at both sides of switch 210, at node 224 (supply source connection) and at node 226 (load connection). An output terminal 220 can provide current to a load. The load can be an accessory to a portable device. In the example of FIG. 2, a current source for supplying current 222 couples to the output terminal 220 to represent the current from a load.

In FIG. 2, voltage supply 204 and an internal resistor 206 model the operation of a source circuit 202 that couples to a supply node 224. Capacitor 208 models the capacitance of source circuit 202 and the conductor that couples source circuit 202 to one current handling terminal of switch 210, and any additional capacitance coupled to node 224. The other current handling terminal of switch 210 couples to output terminal 220. Capacitor 218 models the capacitance of the circuitry connected to terminal 220 and the capacitor of the conductor coupling output terminal 220 to one current handling terminal of switch 210.

One cause of reverse current problems is aggressor currents, such as aggressor current 222 in FIG. 2. An aggressor current is a current that flows into what is normally an output terminal. Switch 210 can be an FET pair sized to handle large currents. In this example: the current handling terminals of the FET pair are the current handling terminals of the switch 210 at nodes 224 and 226; and the gates of the FET pair are the control terminal of switch 210. The system source side of the switch is the system node 224, and the output side of the switch is the accessory node 226.

The inverting input of comparator 214 couples to the system node 224. The non-inverting input of comparator 214 couples to the accessory node 226 via a voltage drop reference 212. Under normal operation, switch 210 is closed. Current through switch 210 causes a voltage drop across switch 210. During normal operation, the voltage drop across switch 210 plus the voltage $V_{OS}$ of voltage drop reference 212 add together to keep the voltage on the non-inverting input of comparator 214 below the voltage on the inverting input of comparator 214. Thus, during normal operation, comparator 214 outputs a logic zero voltage or low voltage signal. The output of comparator 214 couples to the "RCP Detect" input of switch controller 216, which maintains switch 210 in the closed (normal) position based on the low signal from comparator 214.

The voltage $V_{OS}$ is appropriately selected, so that if the reverse current through switch 210 exceeds an allowed amount, then the voltage drop across switch 210 will exceed $V_{OS}$. If a magnitude of reverse current through switch 210 causes the voltage drop across switch 210 to exceed $V_{OS}$, then the voltage on the inverting input of comparator 214 will be lower than the voltage on the non-inverting input. In this condition, comparator 214 outputs a logic one (high) voltage signal to the RCP Detect input of switch controller 216. Based on this high signal, switch controller 216 causes switch 210 to open, which protects source circuit 202 from an excessive reverse current condition.

However, the reverse current condition in circuit 200 might not be harmful to source circuit 202. For example, the reverse current might not be caused by an aggressor current 222 coupled to terminal 220, but instead might be caused by a side load connected to the system node 224. Additional current demand at node 224 can cause the voltage at node 224 to drop, causing reverse current to flow into the output terminal. The current into the node 220 in this condition does not require opening switch 210. This type of benign current fault is acceptable, and the circuit 200 operation should continue. For truly malign current faults, such as when a large aggressor current 222 is forcing excessive reverse current through switch 210 at terminal 220, switch 210 should open. Circuit 200 cannot determine a benign current fault as opposed to a malign current fault.

Figure 3A:
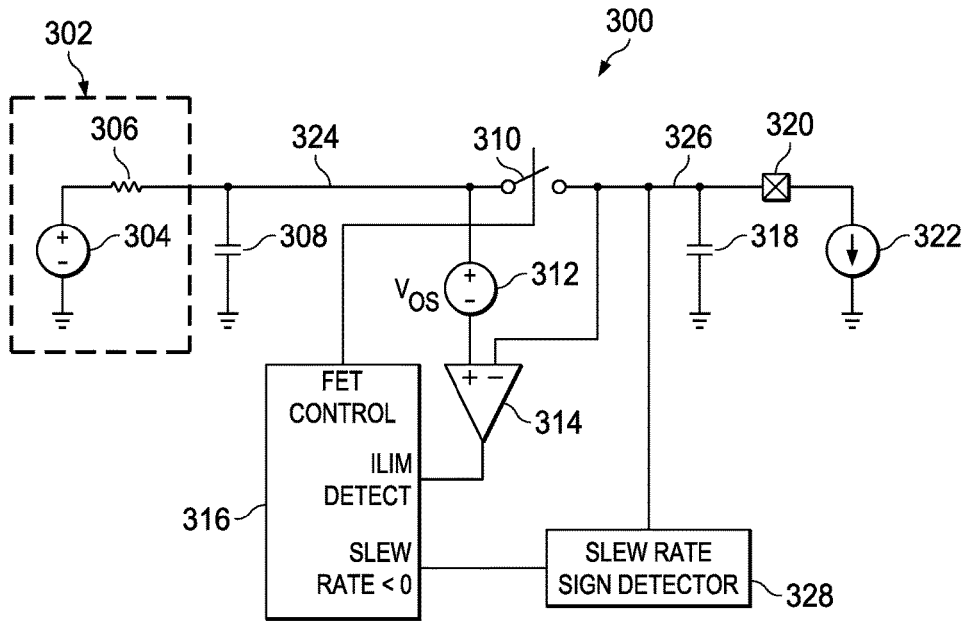
FIG. 3A is a circuit diagram of an over-current protection circuit of example embodiments.

FIG. 3A is a schematic diagram of an embodiment over-current protection circuit 300. For FIG. 3A's components that are similar to components of FIGS. 1 and 2, corresponding reference labels are used for clarity. For example, in FIG. 3A, switch 310 couples to the output terminal 320, similar to switch 210 in FIG. 2 that couples to output terminal 220. In FIG. 3A, voltage source circuit 302 includes a supply 304 and resistor 306. The output of the source circuit 302 couples to switch 310 at node 324. A switch controller 316 has an output coupled to the switch control terminal of switch 310. A comparator 314 couples to both sides of switch 310 at nodes 324 and 326. The output of the comparator 314 couples to a current limit detection input "ILIM Detect" on the switch controller 316. Also, a slew rate sign detector circuit 328 is coupled to a "Slew Rate<0" input of the switch controller 316. The switch 310 couples to an output node 320 where current can supply a load. In FIG. 3A, the load is represented by a current sink 322.

In FIG. 3A, the voltage source circuit 302 can be a battery or other voltage supply. In an example embodiment, the switch controller 316, slew rate sign detector 328, comparator 314, voltage reference 312 and switch 310 can be a single integrated circuit. In an alternative example, the switch 310 can be a separate integrated circuit, while the remaining components are on another separate integrated circuit. In a further alternative, discrete components can form some or all of the components of circuit 300. The switch 310 can be a wide variety of commercially available devices including back-to-back power FETs, single power FETs, SOI FETs, bipolar junction transistors (BJTs) and mechanical relay switches. Multi-chip modules can form packages for the switch and the remaining circuitry in a single packaged device, even when separate integrated circuits implement the switch and the remaining components. Alternative examples include implementing the circuits as an integrated circuit for controlling a separate switch. In another alternative example, a module or circuit board can form the embodiments and can use discrete components to implement the components. In further alternatives, the embodiments can use off the shelf integrated circuits, such as logic circuits, operational amplifiers and power devices.

Comparator 314 is shown in FIG. 3A as an operational amplifier in a comparator configuration. In more alternative embodiments, the circuit 300 can use different comparator circuits. The comparator 314 outputs a signal indicating when a voltage difference between two nodes 324 and 326 exceeds a reference voltage $V_{OS}$ in FIG. 3A. Any comparator that can provide the required output signal can form the comparators in example embodiments. The polarity of the output signal from the comparator is arbitrary and can be active high or active low, depending on the configuration of the switch controller 316.

In operation, voltage supply 304 and an internal resistance 306 model the operation of a supply source circuit 302. Capacitor 308 models the capacitance of source circuit 302, the capacitance of the conductor coupling source circuit 302 to one current handling terminal of switch 310, and the capacitance of other circuits connected to the system node 324. The other current handling terminal of switch 310 at node 326 couples to output terminal 320, which couples to a load 322. In FIG. 3A, the load is represented as a current sink. Capacitor 318 models the capacitance of the circuitry connected to terminal 320 and models the capacitance of the conductor coupling output terminal 320 to one current handling terminal of switch 310, at node 326. In at least one example embodiment, switch 310 can be a back-to-back FET pair sized to handle large currents. In this illustrative example, the current handling terminals of the FET pair are the current handling terminals of the switch 310, and the gates of the FET pair are the control terminal of switch 310. The power source side of the switch 310 is the system node 324, and the output side of the switch 310 is the accessory node 326. In alternative examples, a single FET sized for the application, such as a power FET, can implement switch 310. In additional examples, other power devices can form switch 310. Bipolar junction transistors, SOI FET devices, and mechanical relays can form switch 310.

The non-inverting input of comparator 314 couples to the system node 324 via a voltage reference 312. The inverting input of comparator 314 couples to the accessory node 326. Under normal operation, switch 310 is closed. Current flowing through switch 310 causes a voltage drop across switch 310 due to the on-resistance of the switch 310. During normal operation, the voltage drop across switch 310 is less than the voltage $V_{OS}$ of voltage drop reference 312. The voltage on the non-inverting input of comparator 314 is the voltage on system node 324 minus $V_{OS}$, and the voltage on the inverting input of comparator 314 is the voltage on the system node 324 minus the voltage drop across switch 310. Thus, during normal operation, the voltage on the inverting input of comparator 314 is higher than the voltage on the non-inverting input of comparator 314, and comparator 314 outputs a logic zero (low) signal. This comparator output signal couples to the "ILIM Detect" input of switch controller 316. In response to the low signal, switch controller 316 maintains switch 310 in the closed (normal) position based on the low signal from comparator 314.

As described hereinabove with respect to circuit 100 of FIG. 1, the voltage $V_{OS}$ is appropriately selected, so that if current through switch 310 exceeds an allowed amount, then the voltage drop across switch 310 will exceed $V_{OS}$. If the current through switch 310 rises to a level where the voltage drop across switch 310 exceeds $V_{OS}$, then comparator 314 outputs a logic one (high) voltage signal to the ILIM Detect input of switch controller 316.

Figure 3B:
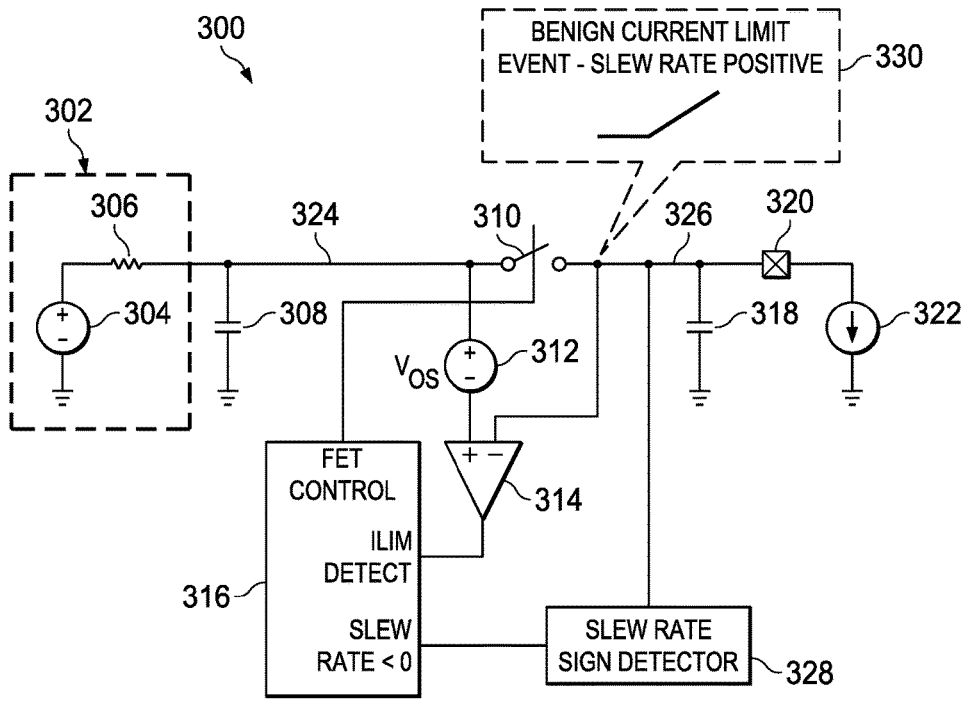
FIG. 3B is a circuit diagram illustrating a benign over-current condition in the circuit of FIG. 3A.
Figure 3C:
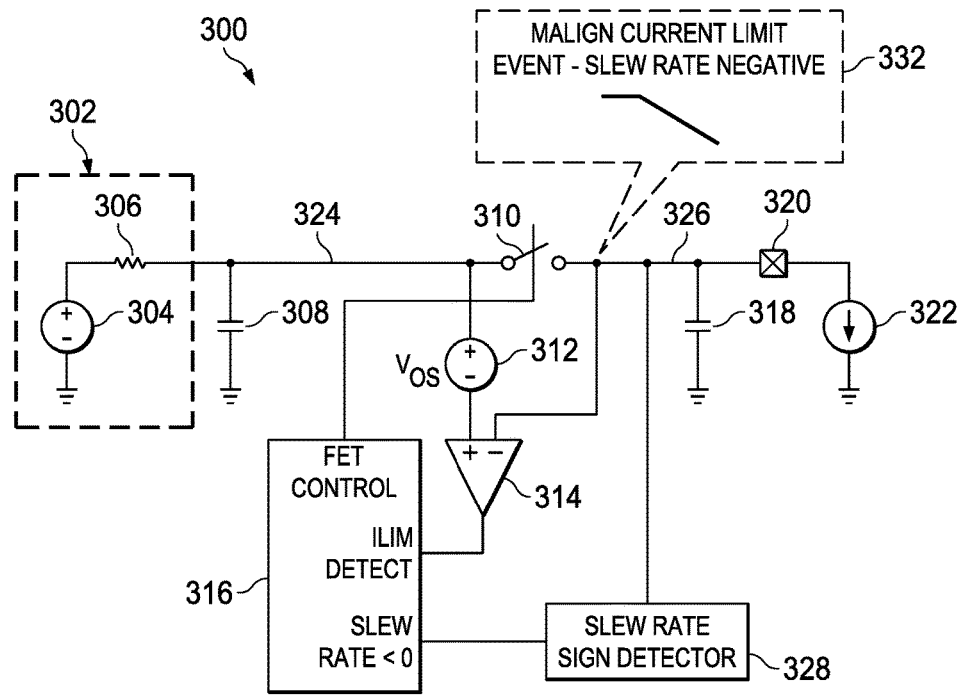
FIG. 3C is a circuit diagram illustrating a malign over-current condition in the circuit of FIG. 3A.

In FIG. 3A, switch controller 316 includes a "Slew Rate<0" input and the ILIM Detect input. Slew rate sign detector 328 has an input coupled to accessory node 326 and an output coupled to Slew Rate<0 input of switch controller 316. Switch controller 316 opens switch 310 (disconnecting the source from the load) only when it receives a logic one (high) voltage signal from both comparator 314 (on the ILIM Detect input) and from slew rate sign detector 328 (on the Slew Rate<0 input). When the switch controller 316 opens switch 310, it protects source circuit 302 from a malign over-current condition. FIGS. 3B and 3C further illustrate the operation of circuit 300. Example slew rate detectors are discussed hereinbelow in connection with FIGS. 10 and 11. In an example embodiment, the slew rate sign detector includes a slew rate detector where the slew rate sign is derived from the detected slew rate.

FIG. 3B is a schematic diagram of over-current protection circuit 300 illustrating the circuit operation in a benign over-current condition. As shown in callout 330, the slope of the voltage at output terminal 320 is rising. Accordingly, the slew rate at accessory node 326 is positive. The positive slew rate at node 326 indicates that the excessive current is charging capacitance 318 due to recovery from a supply issue, and the excessive current is not due to a collapse of the impedance of the load coupled to output terminal 320 (i.e., it is not a short at node 320). Therefore, this condition is a benign condition, and circuit 300 should continue supplying current to the load at terminal 320.

FIG. 3C is a schematic diagram of over-current protection circuit 300 illustrating an operation in a malign over-current condition. As shown in callout 332, the slope of the voltage at the output node 320 is falling. Accordingly, the slew rate of accessory node 326 is negative. The negative slew rate at node 326 indicates that the excessive current through switch 310 is probably due to the collapse of the impedance connected to output terminal 320 (i.e., a short). In this condition, the circuitry must protect source circuit 302. Slew rate sign detector 328 will detect a negative slope and provide a logic one (high) voltage signal to the Slew Rate<0 input of switch controller 316. The presence of this high signal, along with a logic one (high) voltage at the ILIM Detect input, causes switch controller 316 to output FET control signal and open switch 310. In this manner, switch controller 316 and slew rate detector 328 protect source circuit 302 from a malign excess current condition.

In alternative embodiments, the output of the slew rate sign detector 328 can be "deglitched;" that is, prior to opening the switch the output has to be present for a certain amount of time. This time delay could be asymmetric, that is, there might be a different time delay period before the switch is closed again once the slew rate sign detector changes output. The deglitching of the slew rate sign detector prevents erroneous opening of the switch. Also, the slew rate sign detector and/or the switch controller can include a hysteresis circuit so that the switch opens only when the malign current exceeds a certain threshold and the slew rate sign detector also outputs a signal for a time period. In another example, the excess current must be detected for a predetermined time before the switch is opened. Also, once the switch controller turns the switch off, hysteresis can be included so that the switch does not immediately turn back on, but remains off until the excess current falls below another threshold. The circuitry can be arranged with hysteresis and/or with time delays to avoid a chatter condition where the switch is turned on and off in a repeated fashion.

In an additional alternative, the magnitude of the excess current can be used along with the slew rate detection to trigger protection and open the switch, instead of a threshold operation.

Figure 4:
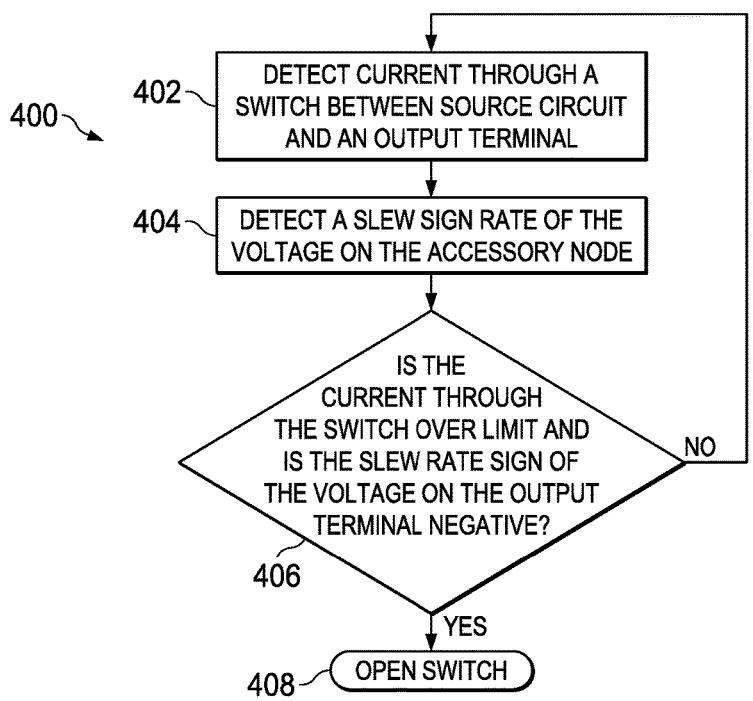
FIG. 4 is a flow diagram of a method of determining a malign over-current condition.

FIG. 4 is a flow diagram of a method 400 of operation of circuit 300 (FIGS. 3A-3C). Beginning at step 402, the circuit 300 detects current through a switch between a source circuit and an output terminal. The switch can supply current to an accessory device or other load. In step 404, the circuit 300 detects a sign of a slew rate (slew rate sign) of a voltage at the output terminal or accessory node. In step 406, the circuit 300 determines whether the current through the switch exceeds a limit and whether the slew rate on the accessory node is negative. If both conditions exist at step 406, then the circuit 300 opens the switch in step 408. Conversely, if either of those conditions does not exist at step 406, then the method returns from step 406 to step 402.

Figure 5A:
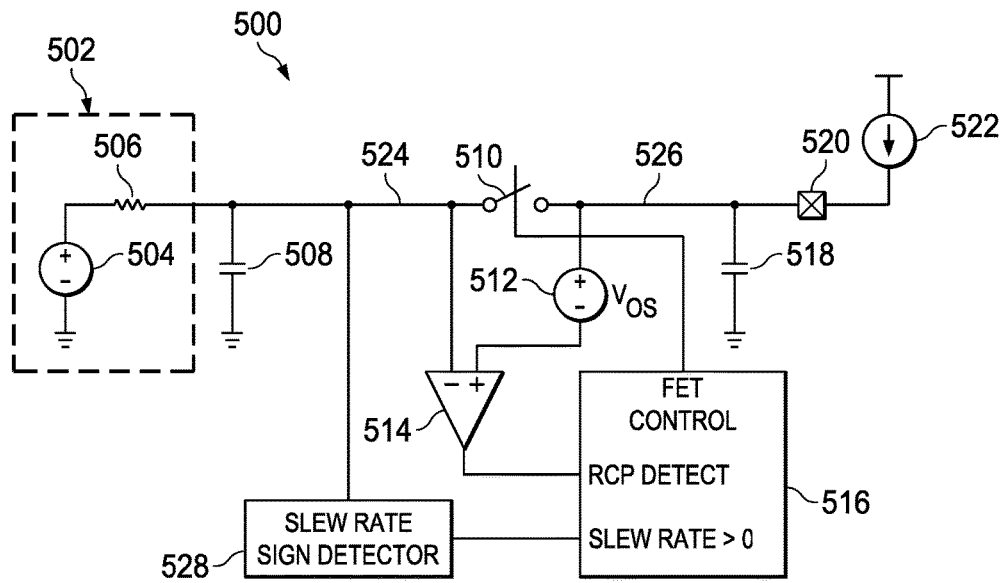
FIG. 5A is a circuit diagram of a reverse current protection circuit.

FIG. 5A is a schematic diagram of a reverse current protection circuit 500 of another embodiment. For FIG. 5A's components that are similar to components of FIGS. 1, 2 and 3A, corresponding reference labels are used for clarity. For example, switch 510 couples to output terminal 520, similar to switch 310 that couples to output terminal 320 in FIG. 3A. As with circuit 200 (FIG. 2), voltage supply 504 and an internal resistance 506 model the operation of source circuit 502, such as a battery or other power supply coupled to node 524. Capacitor 508 models the capacitance of source circuit 502, models the conductor coupling source circuit 502 to one current handling terminal of switch 510, and models the capacitance of other circuits connected to the system node 524. The other current handling terminal of switch 510 couples to output terminal 520. Capacitor 518 models the capacitance on output terminal 520, which may include intentionally placed capacitance, capacitance of other circuits, and conductor capacitance. An aggressor current source 522 illustrates one cause of reverse current. In at least one example, switch 510 is an FET pair sized to handle large currents. In this example, the current handling terminals of the FET pair provide the current handling terminals of the switch 510, and the gates of the FET pair are the control terminal of switch 510. The system source side of the switch 510 is system node 524, and the output side of the switch 510 is the accessory node 526.

In operation, the inverting input of comparator 514 couples to the system node 524. The non-inverting input of comparator 514 couples to the accessory node 526 via a voltage drop reference $V_{OS}$ 512. Under normal operation, switch 510 is closed. Current through switch 510 causes a voltage drop across switch 510 due to the on-resistance of the switch 510. During normal operation, the voltage drop across switch 510 plus the voltage $V_{OS}$ of voltage drop reference 512 keep the voltage on the non-inverting input of comparator 514 below the voltage on the inverting input of comparator 514. Thus, during normal operation, comparator 514 outputs a logic zero (low) voltage signal. This output signal couples to the "RCP Detect" input of switch controller 516, which maintains switch 510 in the closed (normal) position based on the low signal from comparator 514.

As with circuit 200 of FIG. 2, voltage $V_{OS}$ is appropriately selected, so that if the reverse current through switch 510 exceeds an allowed amount, then the voltage drop across switch 510 will exceed $V_{OS}$. If the reverse current through switch 510 rises to a level where the voltage drop across switch 510 exceeds $V_{OS}$, then comparator 514 outputs a logic one (high) voltage signal to the RCP Detect input of switch controller 516.

Switch controller 516 includes a "Slew Rate>0" input and the RCP Detect input. Slew rate sign detector 528 has an input coupled to system node 524 and an output coupled to Slew Rate>0 input of switch controller 516. Switch controller 516 opens switch 510 only when it receives a logic one (high) voltage signal from both comparator 514 (on the RCP Detect input) and from slew rate sign detector 528 (on the Slew Rate>0 input). Switch controller 516 protects source circuit 502 from (against) a malign reverse current condition, as explained further hereinbelow in connection with FIGS. 5B and 5C. In an example, slew rate sign detector 528 can include a slew rate detector where the slew rate sign is derived from the detected slew rate.

As described above with respect to FIG. 3A, the slew rate sign detector 528 and/or the switch controller 516 can include hysteresis circuitry so that the switch opening occurs only after the reverse current is present over a time period, or when the sign of the slew rate is positive for a time period, or when the slew rate exceeds a threshold. In alternative embodiments, the output of the slew rate sign detector 528 can be "deglitched;" that is, prior to opening the switch the output has to be present for a certain amount of time. This time delay could be asymmetric, that is, there might be a different time delay period before the switch is closed again once the slew rate sign detector changes output. The deglitching of the slew rate sign detector prevents erroneous opening of the switch. Also, in additional alternative examples, the slew rate sign detector and/or the switch controller can include a hysteresis circuit so that the switch opens only when the malign current exceeds a certain threshold and the slew rate sign detector also outputs a signal for a time period. In another example, the excess current must be detected for a predetermined time before the switch is opened. Once the switch controller turns the switch off, hysteresis can be included in the switch controller so that the switch does not immediately turn back on, but remains off until the excess current falls below another threshold. The circuitry can be arranged with hysteresis and/or with time delays to avoid a chatter condition where the switch is turned on and off in a repeated fashion. In an additional alternative, the magnitude of the reverse current can be used along with the slew rate detection to trigger protection and open the switch, instead of a threshold operation. Delay circuitry and/or hysteresis circuitry can be used in either the switch controller, the slew rate sign detector, or both to prevent the on and off effects.

Figure 5B:
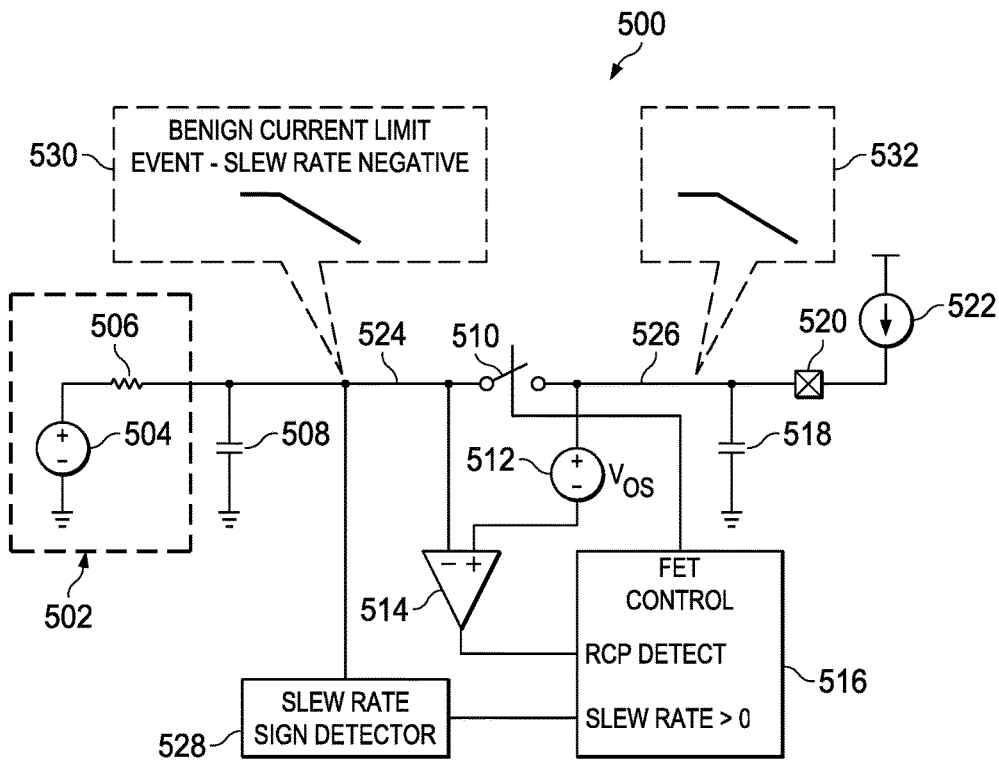
FIG. 5B is a circuit diagram illustrating a benign reverse current condition in the circuit of FIG. 5A.

FIG. 5B is a schematic diagram of the reverse current protection circuit 500, illustrating the operation in a benign reverse current condition. As shown in callout 530, the slope of the voltage at system node 524 is falling. As noted in callout 532, the voltage at the output terminal 520 and accessory node 526 is also falling. Accordingly, the slew rate is negative. A falling slew rate indicates that the reverse current might be caused by a side load (not shown) to the system at node 524, and is not due to an aggressor current injected into output terminal 520. In this case, a benign excess reverse current condition is occurring, and switch 510 should remain closed.

Figure 5C:
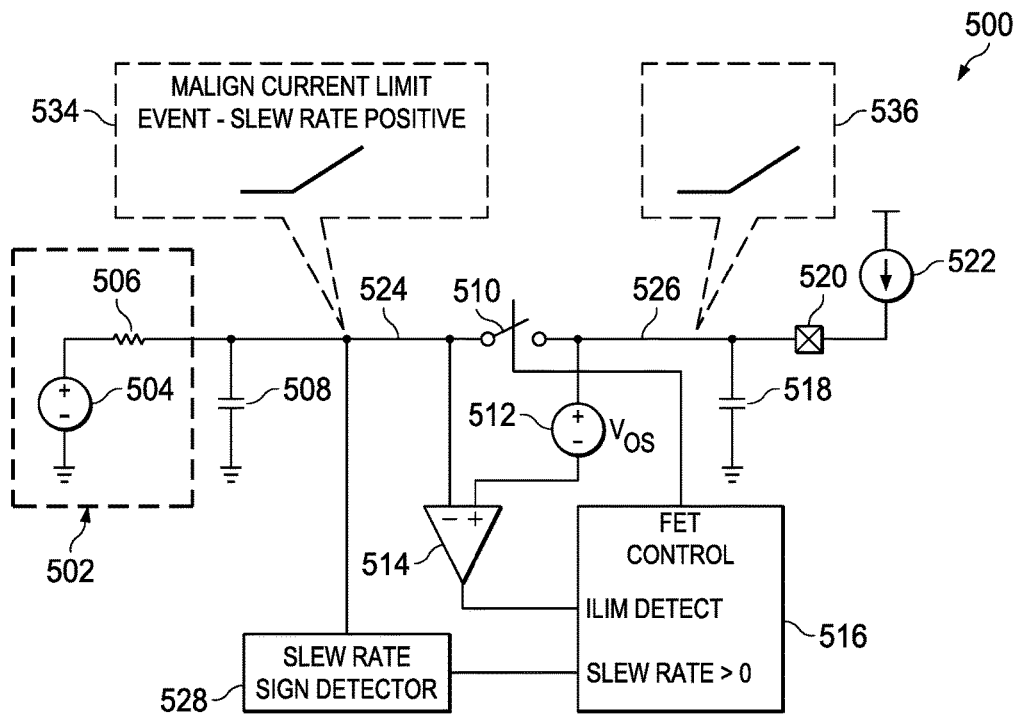
FIG. 5C is a circuit diagram illustrating a malign reverse current condition in the circuit of FIG. 5A.

FIG. 5C is a schematic diagram of reverse current protection circuit 500, illustrating operation in a malign reverse current condition. As shown in callout 534, the slope of the voltage at system node 524 is rising. Accordingly, the slew rate is positive. As noted in callout 536, the voltage at accessory node 526 is also rising. A rising voltage on system node 524 indicates that the reverse current through switch 510 is probably due to an aggressor current 522 coupled to output terminal 520. In this condition, the circuitry must protect source circuit 502. Slew rate sign detector 528 will detect a positive slope at node 524, and will provide a logic one (high) voltage to the Slew Rate>0 input of switch controller 516. When switch controller 516 receives a high voltage on the Slew Rate>0 input along with a logic one (high) voltage on the RCP Detect input, switch controller 516 outputs FET control signal to open switch 510, which protects the switch 510 and source circuit 502.

Figure 6:
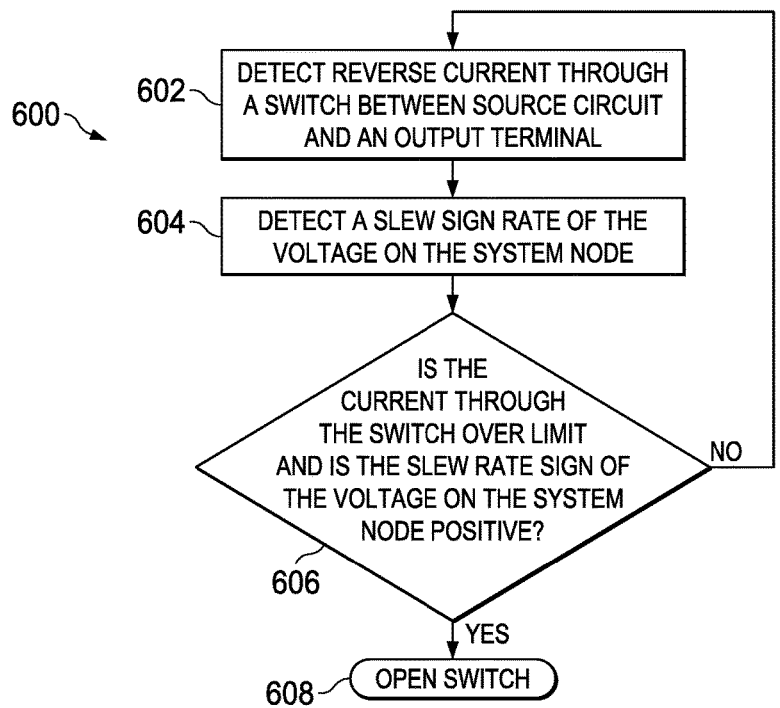
FIG. 6 is a flow diagram of a method for determining malign reverse current.

FIG. 6 is a flowchart of a method 600 of operation of the circuit 500 (FIG. 5A). Beginning at step 602, the circuit 500 detects reverse current through a switch coupled between a source circuit and an output terminal. The output terminal can supply current to an accessory device or other load. An aggressor current at the output terminal can cause reverse current. In step 604, the circuit 500 detects the slew rate of the voltage at the system node. In step 606, the circuit 500 determines whether the reverse current through the switch exceeds a current limit and whether the slew rate on the system node is positive. If both of those conditions exist at step 606, then the circuit 500 opens the switch in step 608. Conversely, if either of those conditions does not exist at step 606, then the method returns from step 606 to step 602.

Figures 7A, 7B:
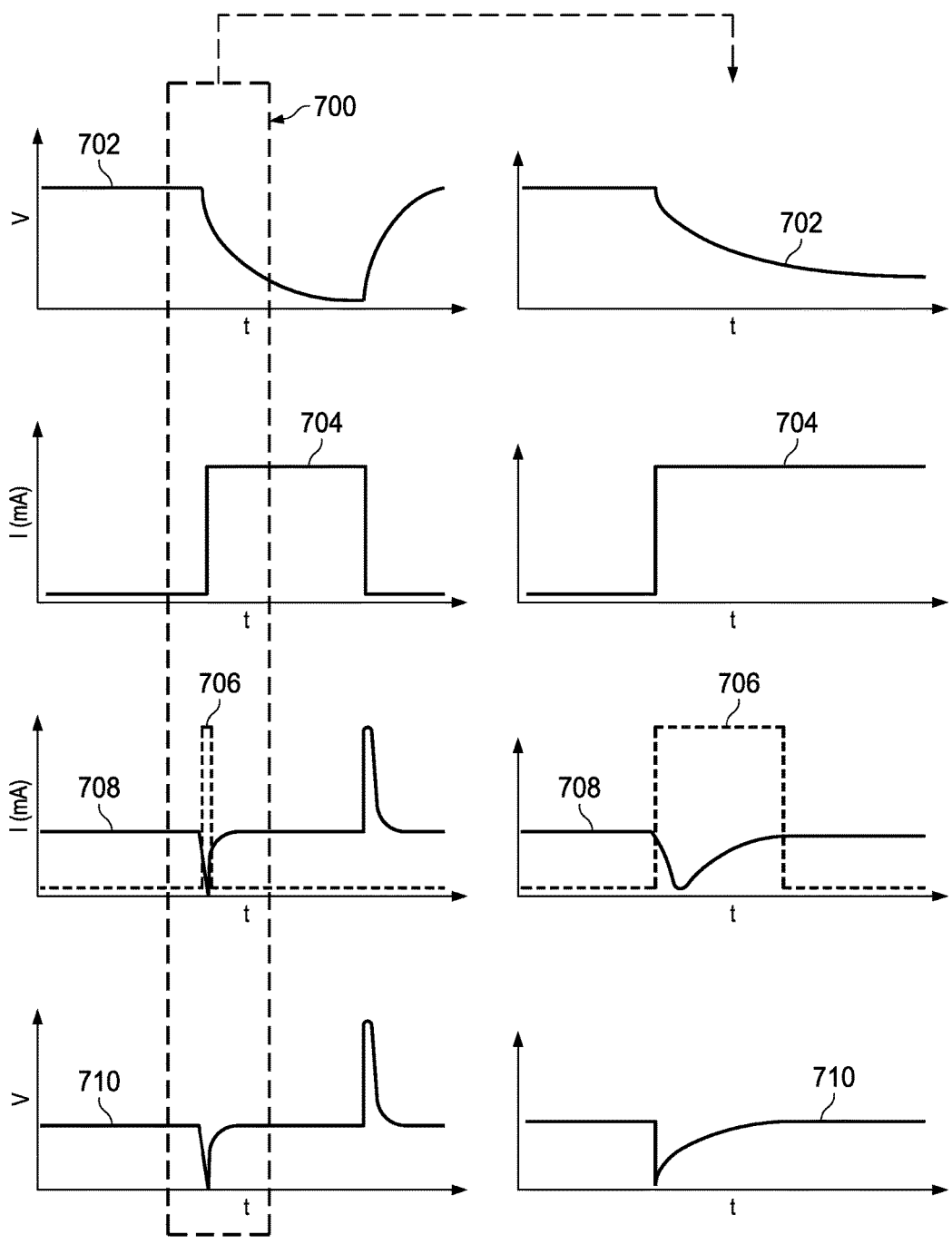
FIGS. 7A and 7B is a group of graphs and insets showing an operation of an example embodiment.

FIG. 7A is a group of graphs showing the operation of the example circuit 500 (FIGS. 5A-5C). In all these graphs, time is shown on the horizontal axis. The graphs of FIG. 7A are derived from a simulation of the circuit 500. The group of graphs in FIG. 7B are the insets of the graphs of FIG. 7A during the time indicated by the dashed box 700. Trace 702 is the voltage at the system node 524 (FIG. 5A). In the simulation, node 524 is at a low voltage due to a side current load 704. A low voltage at node 524 simulates a weak battery supply followed by a return to the proper voltage. The change in voltage at node 524 causes a reverse current for a time period within box 700, and then a return to normal operation, as shown in trace 708. Trace 706 shows the output of comparator 514 (FIG. 5A) spiking to a high voltage, indicating the detection of a reverse current. Voltage at node 526 (shown as trace 708) is superimposed on trace 706. This voltage is dropping in box 700, so it has a negative slew rate. Slew rate detector 529 detects the negative slew rate. Trace 710 shows the output of slew rate detector 528. Thus, FIGS. 7A and 7B show the detection of a benign reverse current event that occurs within the time covered by the inset dotted box 700 in FIG. 7A.

FIG. 8A shows the graphs of FIG. 7A. However, in FIG. 8A and FIG. 8B, dashed box 800 is shown on a portion of the graphs where an over-current condition may be detected by the example embodiment circuit 300 of FIG. 3A. Trace 802 shows the voltage at system node 324 recovering to normal voltage after dropping. However, as the system current returns to a low level as shown in the current trace 804, a spike of current flows through switch 310 (FIG. 3A) as shown in trace 806. This current spike is detected by comparator 314 (FIG. 3A, trace not shown). However, this current will cause a positive slope at the accessory node 326 (FIG. 3A) as capacitor 318 (FIG. 3A) is recharged. This recharging current is detected as a positive slew rate at node 326 as shown in trace 808, which is the output of slew rate detector 328 (FIG. 3A), indicating a benign over-current event.

Figure 9:
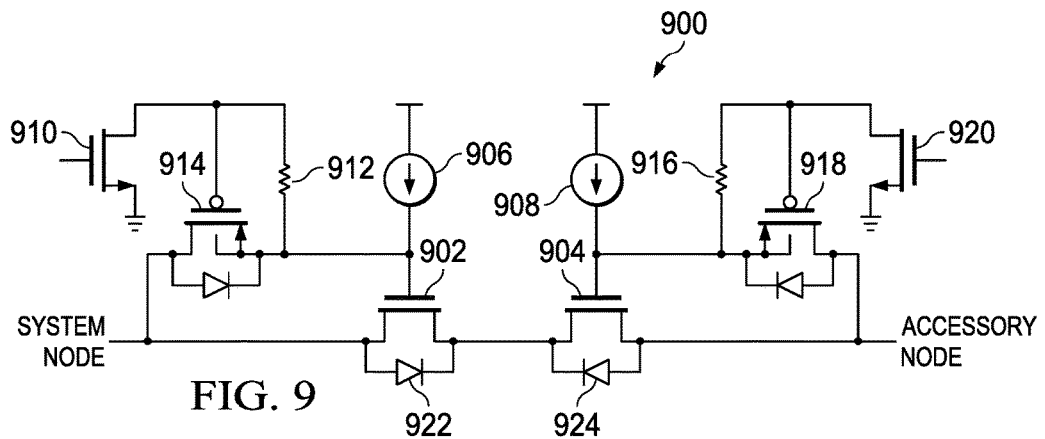
FIG. 9 is a circuit diagram of a back-to-back FET.

FIG. 9 is a diagram of a two FET switch circuit 900, which can be used in an embodiment as the switch 310 (FIG. 3A) or switch 510 (FIG. 5A). Dual FETs 902 and 904 provide a bi-directional switching function. Body diodes 922 and 924 integrate with transistors 902 and 904, respectively. The body diodes 922, 924 provide blocking current protection in both directions, from the supply to the load, and from the load to the supply, due to the use of the back-to-back FET arrangement. The body diodes block current from flowing when the FETs are not active. Current sources 906 and 908 provide charge to the gates of transistors 902 and 906, respectively. Thus, transistors 902 and 904 are normally on (i.e. conductive).

Transistors 918 and 920 and resistor 916 provide a shut off circuit for transistor 904. In normal operation, the gate of transistor 920 has a logic zero (low) voltage, so transistor 920 is not conductive. The current from current source 908 through resistor 916 causes the voltage on P-channel transistor 918 to be high. Thus, transistor 918 is also not conductive. When the gate of transistor 920 has a logic one (high) voltage, transistor 920 becomes conductive. This action pulls the gate of transistor 918 to ground and provides a path for most of the current from current source 908. Because the gate of transistor 918 is low, the gate to source voltage of transistor 904 falls to near zero, shutting off transistor 904. Transistors 910 and 914 and resistor 912 provide the same functions in the same way for transistor 902. The gate terminals of transistors 910, 920 provide the switch control inputs for controlling the back-to-back power FETs 902, 904. When a back-to-back power FET is not powered, the body diodes 922, 924 can provide a current blocking function because one body diode is reverse biased in either direction. No direct current path exists between the system node and the accessory node when the FETs are unpowered, preventing erroneous current flows that might otherwise occur.

In more alternative embodiments, any type of power device with sufficient current carrying capacity to provide accessory level power can be used as the switch. In at least one example, the switch can be formed by a single power FET with the backgate connection coupled to the source. In this example, current blocking is only in one direction, and the circuit 900 may need other current blocking protections for current in the other direction. In alternative embodiments, the switch can be other devices that can pass current from a supply to a load, including SOI FET devices, FETs without the backgate connected to the source, bipolar junction transistors (BJTs), and mechanical relays.

Figure 10:
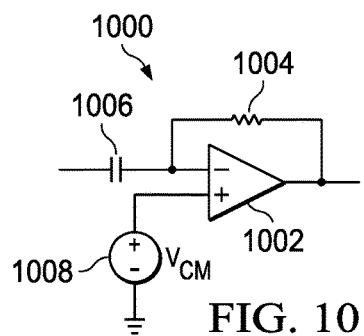
FIG. 10 is a circuit diagram of an example slew rate detector.

FIG. 10 is a circuit diagram of an example slew rate detector 1000 that can implement the slew rate detectors in various embodiments. In at least one example, slew rate detector 1000 may serve as slew rate sign detector 328 (FIG. 3A) or slew rate sign detector 528 (FIG. 5A). Resistor 1004 provides feedback from the output of op amp 1002 to the inverting input of op amp 1002. Voltage reference 1008 provides a constant voltage of $V_{CM}$ (common mode voltage). Thus, under normal circumstances, the output of op amp 1002 is equal to $V_{CM}$ as the only stable output. If an input couples to capacitor 1006 with a rising slew rate, then current flows via capacitor 1006, which raises the voltage on the inverting input of op amp 1002 and causes the output of op amp 1002 to fall to zero. A logic zero (low) voltage at the output of comparator 1002 indicates a rising slew rate. If an input is coupled to capacitor 1006 with a falling slew rate, then current will be pulled from capacitor 1006, which lowers the voltage on the inverting input of op amp 1002 and causes the output of op amp 1002 to rise to a logic one (high) voltage. A logic one (high) voltage at the output of 1002 indicates a falling slew rate. An inverter or buffer (not shown) on the output of op amp 1002 can provide the required signal characteristics (i.e. a change in polarity such as a logic one for a falling slew rate).

Figure 11:
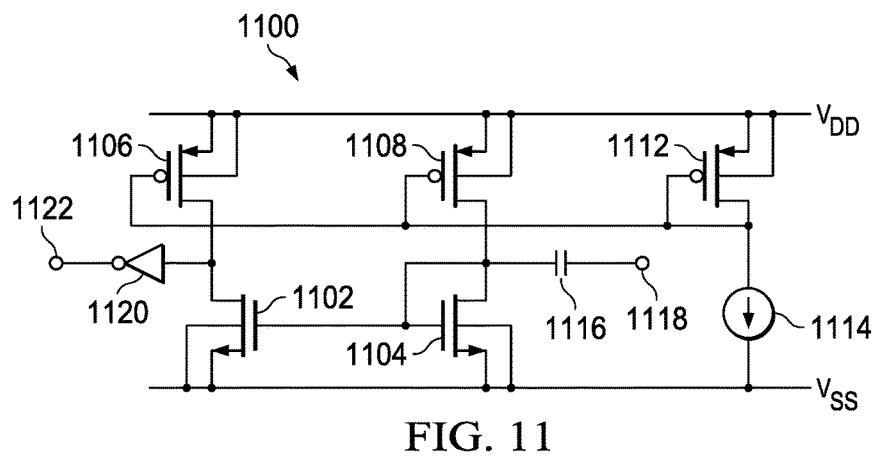
FIG. 11 is a circuit diagram of another example slew rate detector.

FIG. 11 is a circuit diagram of another slew rate detector circuit 1100 that can provide the slew rate detectors in various embodiments. In at least one example, slew rate detector 1100 can serve as slew rate sign detector 328 (FIG. 3A) or slew rate sign detector 528 (FIG. 5A). Slew rate detector 1100 includes a current source 1114 pulling current through gate-strapped P-channel transistor 1112. The gate of transistor 1112 couples to the gates of P-channel transistors 1106 and 1108, which mirror the current of current source 1114 through transistor 1112. Transistors 1102 and 1104 are N-channel transistors. Transistor 1104 is gate strapped so that the current through the transistor 1108 sets the current through transistor 1104. In this example, transistor 1102 is slightly smaller than transistor 1104. Therefore, the gate voltage of gate-strapped transistor 1104 that is applied to the gate of transistor 1102 makes transistor 1102 conduct less current than transistor 1106. The voltage on the input of inverter 1120 is therefore normally high.

In operation, an input signal couples to terminal 1118. If a signal having a positive slew rate couples to terminal 1118, then current flows to the gates of transistors 1102 and 1104 through capacitor 1116. This current causes transistor 1102 to draw more current than transistor 1106 is biased to provide. The voltage on the input of inverter 1120 then falls to zero or near zero. Therefore, a logic one (high) voltage at the output terminal 1122 indicates a positive slew rate, and the output is a logic zero (low) voltage at all other times. In an alternative embodiment, if a particular circuit design requires that a low signal to indicate a positive slew rate, then inverter 1120 can be a non-inverting buffer.

Slew rate detector 1100 can also detect negative slew rates. In this example, transistor 1102 is larger than transistor 1104. Transistor 1102 then tries to draw more current than transistor 1106 is biased to provide.

In operation of this alternate arrangement, the voltage on the input of inverter 1120 is normally low. If a signal having a negative slew rate couples to input terminal 1118, then charge flows from the gates of transistors 1102 and 1104 through capacitor 1116. This discharge causes transistor 1102 to conduct less current than transistor 1106 is biased to provide, and the input of inverter 1120 then goes high. Thus, a logic zero (low) voltage on the output of inverter 1120 indicates detection of a negative slew rate. If a design requires that a high signal indicate a negative slew rate, then inverter 1120 can be a non-inverting buffer.

Figure 12:
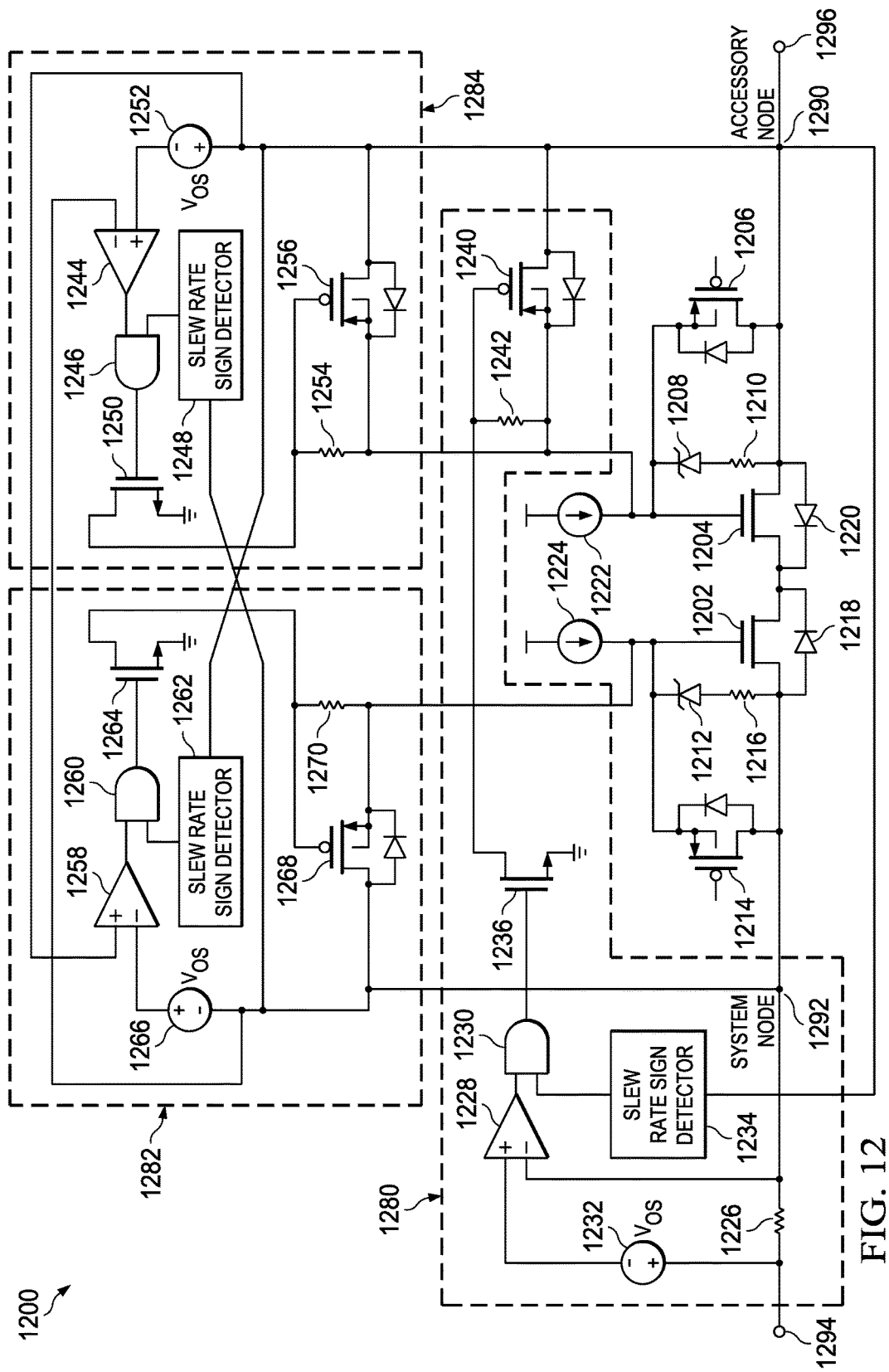
FIG. 12 is a circuit diagram of a protection circuit combining over-current protection with reverse current protection in both directions.

FIG. 12 is a circuit diagram of an additional embodiment 1200. In FIG. 12, circuit 1200 combines over-current protection and reverse current protection in both directions. The circuit 1200 therefore allows detection of aggressor currents at both the system and accessory nodes.

In circuit 1200, circuit 1280 provides over-current protection, circuit 1282 provides reverse current protection in one direction, and circuit 1284 provides reverse current protection in the opposite direction. Various alternative embodiments can use any one or more of circuits 1280, 1282 and 1284. Transistors 1202 and 1204 function as a switch. Body diodes 1218 and 1220 are integral with transistors 1202 and 1204, respectively, and provide current blocking from the system to the load and from the load to the system. Current sources 1224 and 1222 maintain transistors 1202 and 1204, respectively, in the normally on state. P-channel transistor 1214 turns off transistor 1204. Zener diode 1212 and resistor 1216 provide protection from voltage spikes and other anomalies that may damage transistor 1202. P-channel transistor 1206, Zener diode 1208 and resistor 1210 provide the same protection for transistor 1204.

Over-current protection circuit 1280 operates on the same principles as over-current protection circuit 300 (FIG. 3A). In this example, instead of detecting the voltage level through FETs 1202 and 1204, the inputs of comparator 1228 couple to either side of series coupled resistor 1226, which operates as a current sensor. Voltage reference 1232 couples the non-inverting input of comparator 1228 to one side of resistor 1226. The output of comparator 1228 couples to one input of AND gate 1230. The other input of AND gate 1230 couples to the output of slew sign detector 1234, which couples to the accessory node 1290. The output of AND gate 1230 changes to a logic one (high) voltage in response to comparator 1228 detecting an over-current condition while a negative slew rate is detected by slew rate sign detector 1234. This high voltage causes transistor 1236 to turn on and conduct. Transistor 1236 draws most of the current from current source 1222 through resistor 1242. Transistor 1236 also causes the gate of P-channel transistor 1240 to go low, which causes P-channel transistor 1240 to be conductive. P-channel transistor 1240 couples the gate and source of transistor 1204, which draws the gate-to-source voltage for transistor 1204 to near zero. This renders transistor 1204 nonconductive, opening the switch and protecting the system node. If slew rate sign detector 1234 does not detect a negative slew rate on accessory node 1290 when the over-current condition exists, then the over-current is benign. In this case, the output of slew rate sign detector 1234 is zero, and the output of AND gate 1236 is zero. Thus, transistor 1204 will not shut off for a benign over-current.

Reverse current detector 1282 operates on the same principles as RCP circuit 500 (FIG. 5A). Reverse current detector 1282 can shut off transistor 1202 in the event of an aggressor current on accessory node 1290. System node 1292 couples to the inverting input of comparator 1258 via voltage drop reference 1266. The non-inverting input of comparator 1258 couples to accessory node 1290. The input of slew rate sign detector 1262 is a coupled to accessory node 1290. The outputs of comparator 1258 and slew rate sign detector 1262 couple to the inputs of AND gate 1260. If the circuit 1200 detects a high current from accessory node 1290 to system node 1292, while slew rate sign detector 1262 detects a rising slew rated on accessory node 1290, then a malign reverse current is occurring. In this case, AND gate 1260 outputs a high voltage to the gate of transistor 1264, which draws the current from current source 1224 through resistor 1270. This action also causes P-channel transistor 1268 to be conductive. The gate and source terminals of transistor 1202 then couple together, causing transistor 1202 to become nonconductive. Thus, when a malign reverse current is occurring, transistor 1268 becomes conductive, opening the switch 1202 and protecting system node 1292. If slew rate sign detector 1262 does not detect a positive slew rate on accessory node 1290, then the reverse current is benign. Therefore, the output of slew rate sign detector 1262 is zero, and the output of AND gate 1260 is zero. In this case, transistor 1202 will not shut off.

Reverse current detector 1284 also operates on the same principles as RCP circuit 500 (FIG. 5A). Reverse current detector 1284 can shut off transistor 1204 in the event of an aggressor current on system node 1292. Accessory node 1290 couples to the non-inverting input of comparator 1244 via voltage drop reference 1252. The inverting input of comparator 1244 couples to system node 1292. The input of slew rate sign detector 1248 also couples to system node 1292. The outputs of comparator 1244 and slew rate sign detector 1248 couple to the inputs of AND gate 1246. If the circuit 1200 detects high current from system node 1292 to accessory node 1290, while slew rate sign detector 1248 detects a rising slew rated on system node 1292, then a malign reverse current is occurring. In this case, AND gate 1246 outputs a high voltage to the gate of transistor 1250 and draws down the current from current source 1222 through resistor 1254. This action also causes P-channel transistor 1256 to be conductive. Transistor 1256 couples the gate and source terminals of switch 1204, causing transistor 1204 to become nonconductive, opening the switch and protecting accessory node 1290. If slew rate sign detector 1248 does not detect a positive slew rate on system node 1292, then the reverse current is benign. Therefore, in this case, the output of slew rate sign detector 1248 is zero, and the output of AND gate 1246 is zero. Transistor 1250 is not active and transistor 1204 will remain closed.

As described hereinabove with respect to FIGS. 3A and 5A, in alternative embodiments the slew rate sign detectors and switch control circuitry in FIG. 12 can include hysteresis circuitry. The hysteresis circuitry ensures that switch opening occurs only after the reverse current or excess current is present over a time period, or when the sign of the slew rate is positive or negative over a time period, or when the slew rate exceeds a threshold. As described above with respect to FIG. 3A, in alternative embodiments, the output of the slew rate sign detectors in FIG. 12 can be "deglitched." In these embodiments, prior to opening the switch, the output of the slew rate sign detector has to be present for a certain amount of time. This time delay could be asymmetric, that is, there might be a different time delay period before the switch is closed again after the slew rate sign detector changes output. The deglitching of the slew rate sign detectors prevents erroneous opening of the switch. The circuitry 1200 can be arranged with hysteresis and/or with time delays to avoid a chatter condition where the switch is turned on and off in a repeated fashion. In an additional alternative, the magnitude of the excess or reverse current can be used along with the slew rate detection to trigger protection and open the switch, instead of a current limit threshold operation.

In example embodiments, the switches (such as 1202, 1204) in FIG. 12 can be on an integrated circuit that includes the reverse current and over-current detector circuitry, such as 1280, 1282 and 1284. In alternative embodiments, the switches can be a stand-alone integrated circuit. In some embodiments, the switches are power FETs made in semiconductor processes specifically designed for power transistor devices. The remaining circuitry (such as the over-current detector, reverse current detectors, slew rate detectors, and switch controllers described in example embodiments) can be a single integrated circuit. Example embodiments can be implemented by application specific integrated circuits (ASICs), field programmable gate arrays (FPGAs), complex logic programmable devices (CPLDs) and other custom and semi-custom integrated circuit design approaches. In at least one example, the switches are power FETs in an integrated circuit, and power FET gate driver integrated circuits can couple to gate terminals of those power FETs, while the reverse current and over-current detection circuitry can be additional integrated circuits. Example embodiments can be formed by discrete components and off the shelf circuitry, including operational amplifiers and logic circuits installed on a circuit board or module.

Example embodiments include circuitry to discern between benign and malign over-current and reverse current conditions. The protection circuits of example embodiments can interrupt an accessory operation only when necessary to protect system circuitry. At least one example embodiment includes an over-current limit sensor. In another alternative, an embodiment can detect a reverse current exceeding a limit from an output terminal into a switch. In yet another example, an embodiment can detect a reverse current from a supply source through a switch to a load that exceeds a limit. Some embodiments combine these features. Other embodiments provide only over-current protection, or provide only reverse current protection in one or two directions.

In described examples, an integrated circuit includes a supply source terminal coupled to receive a current from a supply source. A switch has: a first current handling terminal coupled to the supply source terminal; a second current handling terminal coupled to an output terminal; and a control terminal. A comparator has: an inverting input coupled to the second current handling terminal; a non-inverting input; and a comparator output. A voltage reference source has: a first terminal coupled to the first current handling terminal; and a second terminal coupled to the non-inverting input of the comparator. A slew rate detector has: an input coupled to the second current handling terminal; and an output. A switch controller has: a first input coupled to the comparator output; a second input coupled to the output of the slew rate detector; and a switch controller output coupled to the control terminal. The switch controller is coupled to provide a signal on the switch controller output to cause the switch to open when the comparator detects an excess reverse current condition through the switch while the slew rate detector detects a positive slew rate.

In a further example of the integrated circuit, the switch controller is coupled to provide a signal on the switch controller output to cause the switch to open when the comparator detects an over-current condition through the switch while the slew rate detector detects a negative slew rate. In yet another example of the integrated circuit, the slew rate detector is a slew rate sign detector. In an additional example of the integrated circuit, the slew rate detector is a slew rate comparator. In still another example of the integrated circuit, the voltage reference source is determined by an on-resistance of the switch and a switch current threshold.

In an alternative example of the integrated circuit, the switch includes at least one field effect transistor.

In still a further example, the integrated circuit includes a second comparator having: a first input coupled to the supply source terminal; a second input; and a second comparator output. In this example, the integrated circuit includes a second voltage reference source having: an input coupled to the output terminal; and an output coupled to the second input of the second comparator. Also, the integrated circuit includes: a second slew rate detector coupled to the first current handling terminal and having an output; and a second switch controller coupled to the second comparator output and to the output of the second slew rate detector and having a second switch controller output coupled to the control terminal. The second switch controller is coupled to provide a signal on the second switch controller output to cause the switch to open when the second comparator detects a reverse current condition from the output terminal into the switch while the second slew rate detector detects a positive slew rate.

In yet another example, the integrated circuit further includes a third comparator having: a first input coupled to the output terminal; a second input; and a third comparator output. In this example, the integrated circuit further includes a third voltage reference source having: an input coupled to the first current handling terminal; and an output coupled to the second input of the third comparator. Also, the integrated circuit in this example includes a third slew rate detector having: an input coupled to the output terminal; and an output. Further, the integrated circuit in this example includes a third switch controller coupled to the third comparator output and to the output of the third slew rate detector and having a third switch controller output coupled to the control terminal. In this example, the third switch controller is coupled to provide a signal on the third switch controller output to cause the switch to open when the third comparator detects a reverse current condition from the supply source terminal into the switch while the third slew rate detector detects a positive slew rate.

In another example, an apparatus includes supply source circuitry having a first output terminal. Also, the apparatus includes a switch having: a first current handling terminal coupled to the first output terminal; a second current handling terminal coupled to a second output terminal; and a control terminal. In this example, the apparatus includes an over-current protection circuit coupled to detect an over-current condition through the switch and to output a signal to the control terminal to open the switch when the over-current condition is a malign event. The apparatus includes: a first reverse current protection circuit coupled to detect a first reverse current from the second output terminal to the first output terminal and to output a signal to the control terminal to open the switch when the first reverse current is a malign event; and a second reverse current protection circuit coupled to detect a second reverse current from the first output terminal to the second output terminal and to output a signal to the control terminal to open the switch when the second reverse current is a malign event.

In another example of the apparatus, the over-current protection circuit includes a comparator having: an inverting input coupled to the first current handling terminal; a non-inverting input; and a comparator output. Also, the over-current protection circuit includes a voltage reference source having: a first terminal coupled to the second current handling terminal; and a second terminal coupled to the non-inverting input of the comparator. Further, the over-current protection circuit includes a slew rate detector having: an input coupled to the first current handling terminal; and an output. In this example, the over-current protection circuit includes a switch controller having: a first input coupled to the comparator output; a second input coupled to the output of the slew rate detector; and a switch controller output coupled to the control terminal. The switch controller is coupled to provide a signal on the switch controller output to cause the switch to open when the comparator detects an excess current through the switch while the slew rate detector detects a negative slew rate.

In a first example of the apparatus, the slew rate detector is a slew rate sign detector. In a second example of the apparatus, the slew rate detector is a slew rate comparator. In a further example, a voltage of the voltage reference source is determined by an on-resistance of the switch and a switch current threshold.

In still another example of the apparatus, the switch includes at least one FET.

In a further example of the apparatus, the first reverse current protection circuit includes a second comparator having: a first input coupled to the first output terminal; a second input; and a second comparator output. A second voltage reference source has: an input coupled to the second output terminal; and an output coupled to the second input of the second comparator. A second slew rate detector is coupled to the first current handling terminal and has an output. A second switch controller is coupled to the second comparator output and to the output of the second slew rate detector and has a second switch controller output coupled to the control terminal. The second switch controller is coupled to provide a signal on the second switch controller output to cause the switch to open when the second comparator detects a reverse current from the second output terminal into the switch while the second slew rate detector detects a positive slew rate, indicating a malign event.

In another example, a method includes detecting whether a current through a switch positioned between a supply source and an output terminal exceeds a current limit. The method also includes detecting a sign of a slew rate of a voltage on the output terminal. In response to the current through the switch exceeding the current limit while the sign of the slew rate of the voltage on the output terminal is negative, the switch is opened to decouple the output terminal from the supply source.

In a further example, the method includes comparing a voltage at the output terminal to a voltage from the supply source added to a reference voltage, where the reference voltage is determined by (e.g., corresponds to) the current limit multiplied by an on-resistance of the switch. In at least one example, the method includes detecting current through the switch from the output terminal to the supply source, and detecting a slew rate sign of the voltage at the supply source. In the method, the switch is opened in response to the current through the switch exceeding a reverse current limit while the slew rate sign of the voltage at the supply source is positive.

In another example, a method for protecting an integrated circuit includes detecting reverse current flowing through a switch between the supply source and an output terminal. The method detects a slew rate sign of a voltage on the output terminal. In response to excess reverse current flowing through the switch while the slew rate sign of the voltage on the output terminal is positive, the switch is opened to decouple circuitry of the supply source from the output terminal.

Modifications are possible in the described embodiments, and other embodiments are possible that are within the scope of the claims.

What is claimed is:

1. An integrated circuit, comprising:
    a current source terminal;
    a switch having: a first switch terminal coupled to the current source terminal; a second switch terminal; and a control terminal;
    a comparator having: a first input coupled to the second switch terminal; a second input; and a comparator output;
    a first voltage reference terminal coupled to the first switch terminal;
    a second voltage reference terminal coupled to the second input of the comparator;
    a slew rate detector having: an input coupled to the second switch terminal; and an output; and
    a switch controller having: a first input coupled to the comparator output; a second input coupled to the output of the slew rate detector; and a switch controller output coupled to the control terminal;
    the switch controller configured to provide a signal on the switch controller output to cause the switch to open responsive to: the comparator detecting an over-current condition through the switch while the slew rate detector detecting a negative slew rate.

2. The integrated circuit of claim 1, wherein the slew rate detector is a slew rate sign detector.

3. The integrated circuit of claim 1, wherein the slew rate detector is a slew rate comparator.

4. The integrated circuit of claim 1, wherein a voltage difference between the first and second voltage reference terminals is determined by an on-resistance of the switch and a switch current threshold.

5. The integrated circuit of claim 1, wherein the switch includes at least one field effect transistor.

6. The integrated circuit of claim 1, wherein the comparator is a first comparator, the comparator output is a first comparator output, the slew rate detector is a first slew rate detector, the switch controller is a first switch controller, the switch controller output is a first switch controller output, and the integrated circuit further comprises:
    a second comparator having: a first input coupled to the first switch terminal; a second input; and a second comparator output;
    a third voltage reference terminal coupled to the second switch terminal;
    a fourth voltage reference terminal coupled to the second input of the second comparator;
    a second slew rate detector having: an input coupled to the first switch terminal; and an output; and
    a second switch controller having: a first input coupled to the second comparator output; a second input coupled to the output of the second slew rate detector; and a second switch controller output coupled to the control terminal.

7. The integrated circuit of claim 6, wherein the second switch controller is configured to provide a signal on the second switch controller output to cause the switch to open responsive to: the second comparator detecting a reverse current from the second switch terminal into the switch; and the second slew rate detector detecting a positive slew rate.

8. The integrated circuit of claim 6, further comprising:
    a third comparator having: a first input coupled to the second switch terminal; a second input; and a third comparator output;
    a fifth voltage reference terminal coupled to the first switch terminal;
    a sixth voltage reference terminal coupled to the second input of the third comparator;
    a third slew rate detector having: an input coupled to the second switch; and an output; and
    a third switch controller having: a first input coupled to the third comparator output; a second input coupled to the output of the third slew rate detector; and a third switch controller output coupled to the control terminal.

9. The integrated circuit of claim 8, wherein the third switch controller is configured to provide a signal on the third switch controller output to cause the switch to open responsive to: the third comparator detecting a reverse current from the first switch terminal into the switch; and the third slew rate detector detecting a positive slew rate.

10. Apparatus, comprising:
    a current source terminal;
    a switch having: a first switch terminal coupled to the current source terminal; a second switch terminal; and a control terminal;
    an over-current protection circuit configured to detect an over-current condition through the switch and to output a signal to the control terminal to open the switch responsive to the over-current condition being a malign event;
    a first reverse current protection circuit configured to detect a first reverse current from the second switch terminal to the first switch terminal and to output a signal to the control terminal to open the switch responsive to the first reverse current being a malign event; and a second reverse current protection circuit configured to detect a second reverse current from the first switch terminal to the second switch terminal and to output a signal to the control terminal to open the switch responsive to the second reverse current being a malign event; wherein the first reverse current protection circuit includes:

a comparator having: an inverting input coupled to the first switch terminal; a non-inverting input; and a comparator output;

a first voltage reference terminal coupled to the second switch terminal; a second voltage reference terminal coupled to the non-inverting input of the comparator;

a slew rate detector having: an input coupled to the first switch terminal; and an output; and a switch controller having: a first input coupled to the comparator output; a second input coupled to the output of the slew rate detector; and a switch controller output coupled to the control terminal;

the switch controller being configured to provide a signal on the switch controller output to cause the switch to open responsive to a malign event indicated by: the comparator detecting a reverse current from the second switch terminal into the switch; and the slew rate detector detecting a positive slew rate.

11. The apparatus of claim 10, wherein the slew rate detector is one of: a slew rate sign detector; and a slew rate comparator.

12. The apparatus of claim 10, wherein a voltage difference between the first and second voltage reference terminals source is determined by an on-resistance of the switch and a switch current threshold.

13. The apparatus of claim 10, wherein the comparator is a first comparator, the comparator output is a first comparator output, the slew rate detector is a first slew rate detector, the switch controller is a first switch controller, the switch controller output is a first switch controller output, and the second reverse current protection circuit includes:

a second comparator having: a first input coupled to the second switch terminal; a second input; and a second comparator output;

a third voltage reference terminal coupled to the first switch terminal;

a fourth voltage reference terminal coupled to the second input of the second comparator;

a second slew rate detector having: an input coupled to the second switch terminal; and an output; and a second switch controller having: a first input coupled to the second comparator output; a second input coupled to the output of the second slew rate detector; and a second switch controller output coupled to the control terminal; the second switch controller being configured provide a signal on the second switch controller output to cause the switch to open responsive to a malign event indicated by; the second comparator detecting a reverse current from the first switch terminal into the switch; and the second slew rate detector detecting a positive slew rate.

14. The apparatus of claim 10, wherein the switch includes at least one field effect transistor.

15. The apparatus of claim 10, further comprising an accessory coupled to the second switch terminal.

16. A method, comprising:

detecting whether a current through a switch positioned between a supply source and an output terminal exceeds a current limit;

detecting a sign of a slew rate of a voltage on the output terminal; and opening the switch to decouple the output terminal from the supply source in response to the current through the switch exceeding the current limit while the sign of the slew rate of the voltage on the output terminal is negative.

17. The method of claim 16, wherein detecting whether the current through the switch exceeds the current limit includes:

comparing a voltage at the output terminal to a voltage from the supply source added to a reference voltage, wherein the reference voltage is determined by the current limit multiplied by an on-resistance of the switch.

18. The method of claim 16, further comprising:

detecting current through the switch from the output terminal to the supply source;

detecting a slew rate sign of the voltage at the supply source; and opening the switch in response to the current through the switch exceeding a reverse current limit while the slew rate sign of the voltage at the supply source is positive.

\* \* \* \* \*